(12) United States Patent
Kadota

(10) Patent No.: US 8,305,163 B2
(45) Date of Patent: *Nov. 6, 2012

(54) TUNABLE FILTER INCLUDING A SURFACE ACOUSTIC WAVE RESONATOR AND A VARIABLE CAPACITOR

(75) Inventor: Michio Kadota, Nagaokayo (JP)

(73) Assignee: Murata Manufacturing Co., Ltd., Kyoto (JP)

( * ) Notice: Subject to any disclaimer, the term of this patent is extended or adjusted under 35 U.S.C. 154(b) by 0 days.

This patent is subject to a terminal disclaimer.

(21) Appl. No.: 13/096,026

(22) Filed: Apr. 28, 2011

(65) Prior Publication Data

US 2011/0199169 A1    Aug. 18, 2011

Related U.S. Application Data

(63) Continuation of application No. PCT/JP2009/006106, filed on Nov. 16, 2009.

(30) Foreign Application Priority Data

Nov. 18, 2008 (JP) .................. 2008-294694

(51) Int. Cl.
*H03H 9/64* (2006.01)

(52) U.S. Cl. ............... 333/195; 310/313 A; 333/193

(58) Field of Classification Search ............. 310/313 B, 310/313 C, 313 D, 313 A; 333/193, 195, 333/194, 196
See application file for complete search history.

(56) References Cited

U.S. PATENT DOCUMENTS

| | | |
|---|---|---|
| 2004/0140734 A1 | 7/2004 | Nakao et al. |
| 2005/0212612 A1 | 9/2005 | Kawakubo et al. |
| 2006/0131991 A1* | 6/2006 | Kawakami ............... 310/311 |
| 2007/0001549 A1 | 1/2007 | Kando |
| 2007/0120439 A1 | 5/2007 | Kadota et al. |
| 2009/0115287 A1 | 5/2009 | Kando |
| 2009/0174285 A1 | 7/2009 | Kando |
| 2009/0200894 A1 | 8/2009 | Kando et al. |
| 2009/0265904 A1 | 10/2009 | Kando et al. |

FOREIGN PATENT DOCUMENTS

| | | |
|---|---|---|
| JP | 01-277011 A | 11/1989 |
| JP | 06-132760 A | 5/1994 |
| JP | 06-268469 A | 9/1994 |
| JP | 09-083030 A | 3/1997 |
| JP | 11-274883 A | 10/1999 |
| JP | 2004-228689 A | 8/2004 |
| JP | 2005-217852 A | 8/2005 |
| JP | 2006-270906 A | 10/2006 |

(Continued)

OTHER PUBLICATIONS

Machine translation into English of JP 06-132760, published May 13, 1994.*
Machine translation into English of JP 2006-270906, published Oct. 5, 2006.*
Official Communication issued in International Patent Application No. PCT/JP2009/006106, mailed on Feb. 16, 2010.

(Continued)

*Primary Examiner* — Barbara Summons
(74) *Attorney, Agent, or Firm* — Keating & Bennett, LLP

(57) ABSTRACT

A tunable filter includes a surface acoustic wave resonator, in which an IDT electrode is defined by an electrode material provided in a recess in an upper surface of a piezoelectric substrate made of $LiNbO_3$ or $LiTaO_3$, and a ZnO film is arranged to cover the upper surface of the piezoelectric substrate, and variable capacitors connected with the surface acoustic wave resonator.

10 Claims, 9 Drawing Sheets

FOREIGN PATENT DOCUMENTS

| | | |
|---|---|---|
| WO | 2005/086345 A1 | 9/2005 |
| WO | 2006/011417 A1 | 2/2006 |
| WO | 2006/114930 A1 | 11/2006 |
| WO | 2008/038506 A1 | 4/2008 |
| WO | 2008/062639 A1 | 5/2008 |
| WO | 2008/087836 A1 | 7/2008 |
| WO | 2008/123131 A1 | 10/2008 |

OTHER PUBLICATIONS

Kadota: "Tunable Filter"; U.S. Appl. No. 13/096,019, filed Apr. 28, 2011.

Official Communication issued in corresponding Japanese Patent Application No. 2010-539133, mailed on Jul. 3, 2012.

\* cited by examiner

TUNABLE FILTER INCLUDING A SURFACE ACOUSTIC WAVE RESONATOR AND A VARIABLE CAPACITOR

BACKGROUND OF THE INVENTION

1. Field of the Invention

The present invention relates to a tunable filter preferably for use as a band filter in a communication system and in which a frequency band can be adjusted, and more particularly, to a tunable filter including a surface acoustic wave resonator.

2. Description of the Related Art

Occasionally, a bandpass filter used in a communication system having an adjustable pass band is required. Various bandpass filters, i.e., tunable filters, that satisfy this requirement have been suggested.

For example, Japanese Unexamined Patent Application Publication No. 2005-217852 discloses a tunable filter that uses a plurality of surface acoustic wave resonators and a plurality of variable capacitors. FIG. 17 is a circuit diagram of the tunable filter described in Japanese Unexamined Patent Application Publication No. 2005-217852.

In a tunable filter 101, a plurality of series-arm resonators 104 and 105 are connected in series with a series arm that couples an input terminal 102 and an output terminal 103 to each other. In addition, parallel-arm resonators 106 and 107 are respectively connected with a plurality of parallel arms provided between the series arm and a ground potential. The series-arm resonators 104 and 105 and the parallel-arm resonators 106 and 107 are defined by surface acoustic wave resonators.

A ladder filter circuit including the series-arm resonators 104 and 105 and the parallel-arm resonators 106 and 107 is provided. Further, to allow the pass band to be adjusted, variable capacitors 108 to 115 are provided. In particular, the variable capacitor 108 is connected in parallel with the series-arm resonator 104, and the variable capacitor 110 is connected in series with the series-arm resonator 104 and the variable capacitor 108. Similarly, the variable capacitor 109 is connected in parallel with the series-arm resonator 105, and is connected in series with the variable capacitor 111.

The variable capacitor 112 is connected in parallel with the parallel-arm resonator 106, and the variable capacitor 114 is connected in series with the parallel-arm resonator 106 and the variable capacitor 112. Similarly, the variable capacitor 113 is connected in parallel with the parallel-arm resonator 107, and is connected in series with the variable capacitor 115.

In the tunable filter 101, a resonant frequency FrS of a circuit portion of the series arm is increased as the capacities of the variable capacitors 110 and 111, i.e., the series capacity is decreased. Also, an anti-resonant frequency FaS of the series arm is decreased as the parallel capacity, i.e., the electrostatic capacities of the variable capacitors 108 and 109 are increased.

Similarly, a resonant frequency FrP and an anti-resonant frequency FaP of a circuit portion of the parallel arms can be changed by changing the capacities of the variable capacitors 112 and 113 that are connected in parallel and the capacities of the variable capacitors 114 and 115 that are connected in series. Accordingly, the center frequency of the entire tunable filter 101 can be changed by changing the capacities of the variable capacitors 108 to 115.

However, with the tunable filter 101 described in Japanese Unexamined Patent Application Publication No. 2005-217852, the surface acoustic wave resonators used for the series-arm resonators 104 and 105 and the parallel-arm resonators 106 and 107 have small electromechanical coupling coefficients. Also, a sufficient band width ratio or a sufficient variable amount has not been obtained. Further, there has been a problem in which an absolute value of a temperature coefficient of frequency TCF is large.

SUMMARY OF THE INVENTION

To overcome the problems described above, preferred embodiments of the present invention provide a tunable filter having an increased electromechanical coupling coefficient of a surface acoustic wave resonator, an increased band width ratio, an increased variable width of frequencies of the tunable filter, and a decreased absolute value of a temperature coefficient of frequency TCF.

A tunable filter according to a preferred embodiment of the present invention preferably includes a surface acoustic wave resonator including a piezoelectric substrate made of $LiNbO_3$ or $LiTaO_3$, for example, and including a recess in an upper surface, an IDT electrode including an electrode material embedded in the recess in the upper surface of the piezoelectric substrate, and a ZnO film arranged to cover the upper surface of the piezoelectric substrate. Further, the tunable filter preferably includes a variable capacitor connected to the surface acoustic wave resonator.

Hereinafter, $LiNbO_3$ is occasionally abbreviated as LN. Also, $LiTaO_3$ is occasionally abbreviated as LT.

In a tunable filter according to a preferred embodiment of the present invention, for example, the piezoelectric substrate is preferably a $LiNbO_3$ substrate with Euler angles of (0°, 100°±20°, 0°) and the electrode material used for the IDT electrode is preferably Al, Ag, Pt, Au, Ta, W, Mo, Ni, or Cu. In this case, the electromechanical coupling coefficient of the surface acoustic wave resonator is further increased, and, thus, the band width ratio and the frequency variable width of the tunable filter are increased.

In a tunable filter according to another preferred embodiment of the present invention, the IDT electrode of the surface acoustic wave resonator is preferably primarily made of an electrode layer made of Al, for example. In this case, when h is a thickness of the ZnO film and $\lambda$ is a wavelength determined by a pitch of electrode fingers of the IDT electrode of the surface acoustic wave resonator, a normalized film thickness $h/\lambda$ of the ZnO film is preferably in a range from about 0.0007 to about 0.006, for example. Accordingly, as compared to a case in which the ZnO film is not provided, the electromechanical coupling coefficient of the surface acoustic wave resonator is further increased and, thus, the band width ratio and the frequency variable width of the tunable filter is further increased.

In a tunable filter according to another preferred embodiment of the present invention, the IDT electrode of the surface acoustic wave resonator is preferably primarily made of an electrode layer that is made of a material selected from Ni, Cu, Mo, and an alloy primarily made of at least one of Ni, Cu, and Mo, for example. In this case, when h is a thickness of the ZnO film and $\lambda$ is a wavelength determined by a pitch of electrode fingers of the IDT electrode, a normalized film thickness $h/\lambda$ of the ZnO film is preferably in a range from about 0.004 to about 0.045, for example. Accordingly, as compared to a case in which the ZnO film is not provided, the electromechanical coupling coefficient of the surface acoustic wave resonator is further increased and, thus, the band width ratio is increased.

In a tunable filter according to another preferred embodiment of the present invention, the IDT electrode of the surface acoustic wave resonator is preferably primarily made of an electrode layer that is made of a material selected from Pt, Au, W, Ta, Ag, and an alloy primarily made of at least one of Pt, Au, W, Ta, and Ag, for example. In this case, when h is a thickness of the ZnO film and λ is a wavelength determined by a pitch of electrode fingers of the IDT electrode, a normalized film thickness h/λ of the ZnO film is preferably in a range from about 0.005 to about 0.14. Also in this case, as compared to case in which the ZnO film is not provided, the electromechanical coupling coefficient of the surface acoustic wave resonator is further increased and, thus, the band width ratio and the frequency variable width of the tunable filter are increased.

In a tunable filter according to another preferred embodiment of the present invention, the IDT electrode is preferably a laminated body including the electrode layer and a second electrode layer that is made of a metal different from the metal used for the electrode layer. An average density of the laminated body is preferably substantially the same as a density of the metal or the alloy used for the electrode layer. Also in this case, as compared to a case in which the ZnO film is not provided, the electromechanical coupling coefficient of the surface acoustic wave resonator is further increased and, thus, the band width ratio and the frequency variable width of the tunable filter are increased.

In a tunable filter according to another preferred embodiment of the present invention, a $SiO_2$ film is preferably laminated on the ZnO film. In this case, since the absolute value of the temperature coefficient of frequency TCF of the surface acoustic wave resonator is small, a change in frequency characteristic as a result of a change in temperature is reduced.

In a tunable filter according to another preferred embodiment of the present invention, a $SiO_2$ film is preferably laminated between the upper surface of the piezoelectric substrate and the ZnO film. In this case, since the absolute value of the temperature coefficient of frequency TCF of the surface acoustic wave resonator is small, a change in frequency characteristic as a result of a change in temperature is reduced.

With the tunable filter according to various preferred embodiments of the present invention, by changing the electrostatic capacity of the variable capacitor, the frequency band can be adjusted. Also, in the surface acoustic wave resonator, since the piezoelectric substrate is preferably made of $LiNbO_3$ or $LiTaO_3$, the IDT electrode is preferably defined by the electrode material embedded in the recess in the upper surface of the piezoelectric substrate, and the ZnO film is arranged to cover the upper surface of the piezoelectric substrate, the electromechanical coupling coefficient of the surface acoustic wave resonator is increased. Thus, the band width ratio of the tunable filter and the frequency variable amount of the tunable filter are increased.

The above and other elements, features, steps, characteristics and advantages of the present invention will become more apparent from the following detailed description of the preferred embodiments with reference to the attached drawings.

DETAILED DESCRIPTION OF THE PREFERRED EMBODIMENTS

Preferred embodiments of the present invention will be described below with reference to the figures.

Figure 1A:
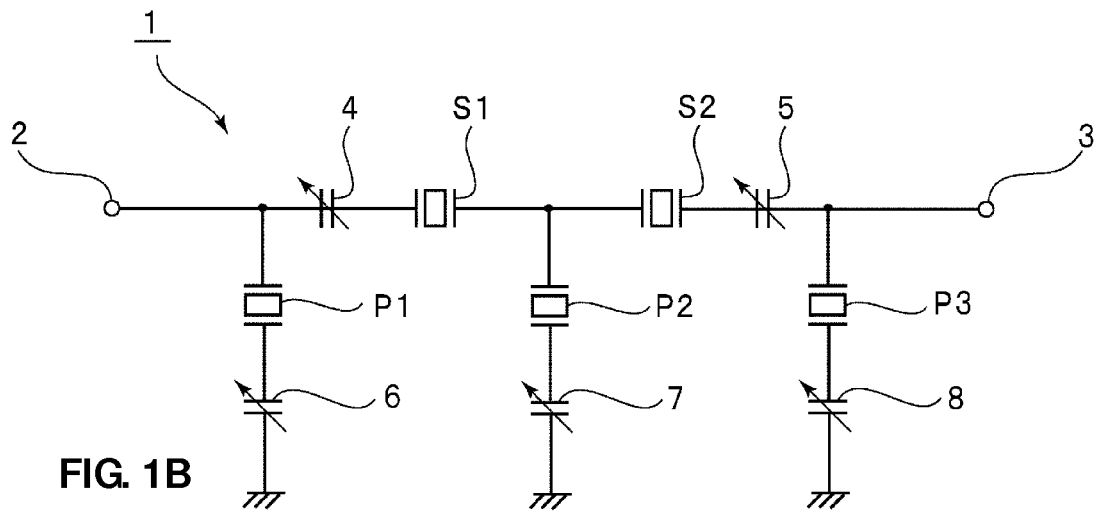
FIG. 1A is an illustration showing a circuit configuration of a tunable filter according to a preferred embodiment of the present invention.
Figure 1B:
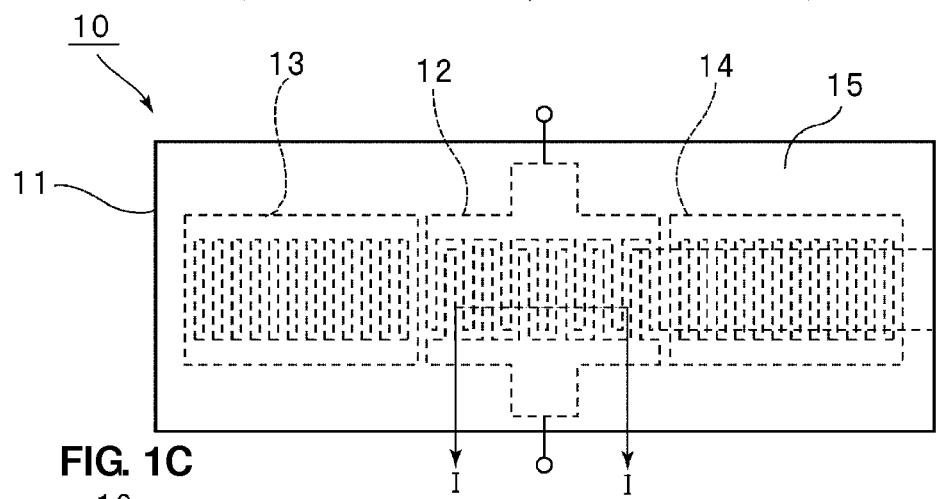
FIG. 1B is a schematic plan view showing a surface acoustic wave resonator used in this preferred embodiment of the present invention.
Figure 1C:
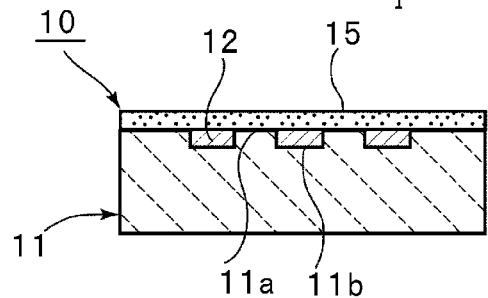
FIG. 1C is a front cross-sectional view of a portion taken along line I-I in FIG. 1B.

FIG. 1A is a circuit diagram of a tunable filter according to a preferred embodiment of the present invention, FIG. 1B is a schematic plan view showing a surface acoustic wave resonator used in the tunable filter, and FIG. 1C is a front cross-sectional view of a portion taken along line I-I in FIG. 1B.

As shown in FIG. 1A, a tunable filter 1 preferably includes an input terminal 2 and an output terminal 3. A plurality of series-arm resonators S1 and S2 are preferably connected in series with a series arm that couples the input terminal 2 and the output terminal 3 to each other. A variable capacitor 4 is preferably connected in series with the series-arm resonator S1 at the input side of the series-arm resonator S1. Also, a variable capacitor 5 is preferably connected in series with the series-arm resonator S2 at the output side of the series-arm resonator S2.

A first parallel arm that couples the series arm and a ground potential to each other is preferably provided at the input side of the series-arm resonator S1. A parallel-arm resonator P1 is preferably connected with the first parallel arm. In the first parallel arm, a variable capacitor 6 is preferably connected in series with the parallel-arm resonator P1. Also, a second parallel arm is preferably provided between a node of the series-arm resonators S1 and S2 and the ground potential. A second parallel-arm resonator P2 is preferably connected with the second parallel arm. A variable capacitor 7 is preferably connected in series with the parallel arm resonator P2. Further, a third parallel arm is preferably provided to couple the series arm and the ground potential to each other, at the output side of the series-arm resonator S2. In the third parallel arm, a variable capacitor 8 is preferably connected in series with a parallel-arm resonator P3.

The series-arm resonators S1 and S2, and the parallel-arm resonators P1 to P3 are preferably defined by surface acoustic wave resonators. With a ladder filter, a pass band is set by a resonant frequency of a series-arm resonator and an anti-resonant frequency of a parallel-arm resonator as is known in the art. When the variable capacitors 4 to 8 are connected in series with the series-arm resonators or the parallel-arm resonators, and when the electrostatic capacities of the variable capacitors 4 to 8 are changed, resonant characteristics in the series arm and in the parallel arms can be changed. Thus, similar to the tunable filter described in Japanese Unexamined Patent Application Publication No. 2005-217852, the center frequency of the tunable filter 1 can be changed.

The series-arm resonators S1 and S2, and the parallel-arm resonators P1 to P3 are preferably defined by surface acoustic wave resonators. The structure of the series-arm resonator S1 will be described as a representative example of a surface acoustic wave resonator. As shown in FIG. 1B and FIG. 1C, a surface acoustic wave resonator 10 that defines the series-arm resonator S1 includes a piezoelectric substrate 11. In this preferred embodiment, the piezoelectric substrate 11 is preferably made of 15° Y cut X propagation $LiNbO_3$, for example. That is, a $LiNbO_3$ substrate with Euler angles of (0°, 105°, 0°), for example, is preferably used as the piezoelectric substrate 11.

A plurality of grooves 11b are preferably provided as recesses in an upper surface 11a of the piezoelectric substrate 11. By filling the grooves 11b with an electrode material, an IDT electrode 12 is provided. As shown in FIG. 1B, in this preferred embodiment, reflectors 13 and 14 are preferably provided on both sides of the IDT electrode 12 in a surface acoustic wave propagation direction. Thus, a single-port-type surface acoustic wave resonator 10 is provided.

The reflectors 13 and 14 are also preferably formed by filling a plurality of grooves provided in the upper surface 11a of the piezoelectric substrate 11, with an electrode material.

As shown in FIG. 1C, an upper surface of the IDT electrode 12, i.e., an upper surface of electrode fingers, is preferably flush or substantially flush with the upper surface 11a of the piezoelectric substrate 11.

Thus, after the IDT electrode 12 and the reflectors 13 and 14 are formed, the upper surface 11a of the piezoelectric substrate 11 is flat or substantially flat. A ZnO film 15 is preferably arranged to cover the upper surface 11a of the piezoelectric substrate 11.

Although the series-arm resonator S1 has been described as an example, the series-arm resonator S2 preferably has substantially the same configuration. The resonant frequencies of the series-arm resonators S1 and S2 are arranged within a pass band of the tunable filter 1. The anti-resonant frequencies of the series-arm resonators S1 and S2 are arranged in a stop band at the higher side of the pass band. The resonant frequencies of the parallel-arm resonators P1 to P3 are arranged in a stop band at the lower side of the pass band. The anti-resonant frequencies of the parallel-arm resonators P1 to P3 are arranged within the pass band.

In the tunable filter 1 according to this preferred embodiment, since the series-arm resonators S1 and S2, and the parallel-arm resonators P1 to P3 are defined by the surface acoustic wave resonators having the above-described specific structures, an electromechanical coupling coefficient is increased. Accordingly, a band width ratio is increased, and a variable width of frequencies of the tunable filter is increased. This will be clarified based on examples of preferred embodiments of the present invention.

EXAMPLE 1

Figure 2:
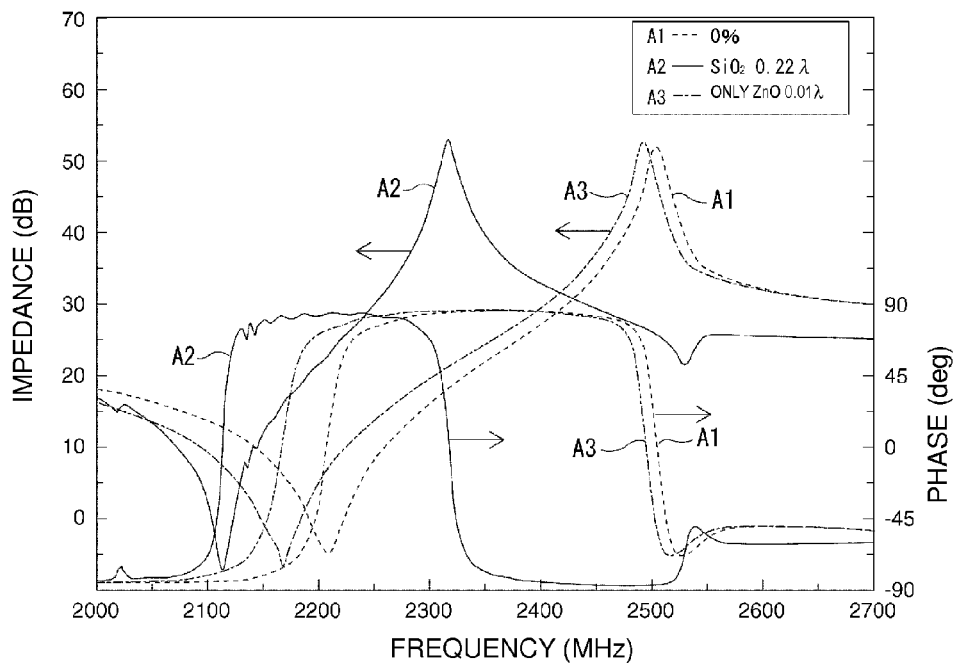
FIG. 2 is an illustration showing frequency characteristics of a surface acoustic wave resonator measured in Example 1, solid lines indicating an impedance characteristic and a phase characteristic of a surface acoustic wave resonator when a $LiNbO_3$ substrate is used and a $SiO_2$ film has a film thickness of about 0.22, where λ is a wavelength of the surface acoustic wave resonator, broken lines indicating an impedance characteristic and a phase characteristic of a surface acoustic wave resonator similar to the former resonator except that a $SiO_2$ film or a ZnO film is not formed, dotted-chain lines indicating an impedance characteristic and a phase characteristic when a ZnO film is formed on a $LiNbO_3$ substrate by a thickness of 0.01λ.

Broken lines in FIG. 2 indicate an impedance characteristic and a phase characteristic of a surface acoustic wave resonator in Example 1. In Example 1, a $LiNbO_3$ substrate of 15° Y cut X propagation, i.e., a $LiNbO_3$ substrate with Euler angles of (0°, 105°, 0°) was used, and Al was used as the electrode material. Frequency characteristics were obtained when the IDT electrode 12 has a film thickness of about 0.17λ where λ is a wavelength of the surface acoustic wave resonator.

A dotted-chain line in FIG. 2 indicates an impedance characteristic and a phase characteristic when a ZnO film with a thickness of about 0.01λ is provided on the $LiNbO_3$ substrate. The resonant frequency is reduced by about 2%. However, the band is increased by about 12%. Also, an impedance ratio that is a ratio of an impedance at an anti-resonant point to an impedance at a resonant point has a maximum value of about 61 dB.

Solid lines indicate an impedance-frequency characteristic and a phase characteristic when a $SiO_2$ film with a thickness of about 0.22λ is additionally formed.

As shown in FIG. 2, the frequency range can be adjusted so as to decrease the resonant frequency and the anti-resonant frequency, and the band can be significantly increased, by providing the ZnO film. Also, the impedance ratio that is the ratio of the impedance at the anti-resonant point to the impedance at the resonant point was about 57.5 dB when neither the $SiO_2$ film nor the ZnO film was provided. In contrast, when the ZnO film is provided, the impedance ratio has a maximum value of about 61 dB. When the $SiO_2$ film is provided, the impedance ratio has a maximum value of about 60.2 dB.

Further, a temperature coefficient of frequency TCF was about −100 ppm/° C. when neither the $SiO_2$ film nor the ZnO film was provided. In contrast, when the ZnO film is provided, an absolute value of TCF has a value in a range from about −70 ppm/° C. to about −80 ppm/° C. When the $SiO_2$ film is provided, an absolute value of TCF has value of about 5 ppm/° C.

It is to be noted that substantially the same frequency temperature characteristic can be obtained even when the arrangement of the $SiO_2$ film and the ZnO film are reversed.

Thus, when the $SiO_2$ film is provided, the band is narrowed from about 13.5% to about 10%. However, when the ZnO film is provided, the peak-to-valley ratio, namely the impedance ratio is increased, and the electromechanical coupling coefficient $k^2$ is increased. Accordingly, the band is increased to about 14.9%. In addition, the temperature characteristic is improved.

EXAMPLE 2

Figure 3:
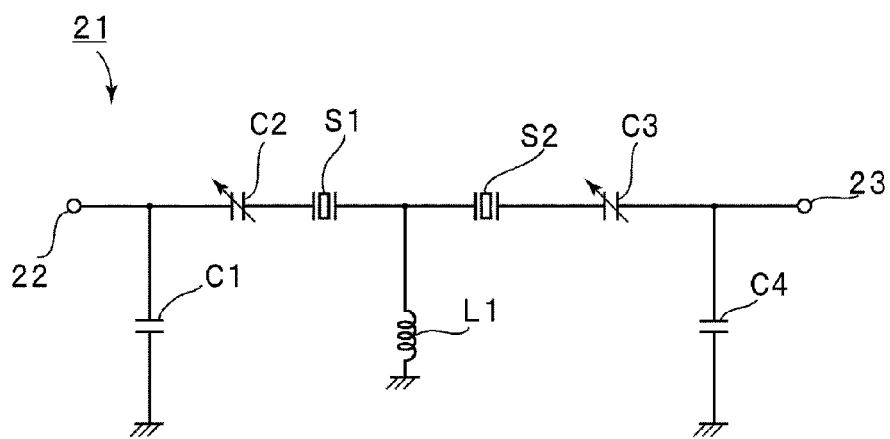
FIG. 3 is a circuit diagram showing a filter circuit in Example 2.

Next, a filter circuit 21 shown in FIG. 3 was provided, and a change in filter characteristic due to a change in electrostatic capacity of a variable capacitor was studied. In the filter circuit 21 shown in FIG. 3, series-arm resonators S1 and S2 are preferably connected in series with each other in a series arm that couples an input terminal 22 and an output terminal 23 to each other. A variable capacitor C2 is preferably connected in series with the series-arm resonator S1 at the input side of the series-arm resonator S1. A parallel arm that couples the series arm and a ground potential to each other is preferably provided at the input side of the series-arm resonator S1. A capacitor C1 is preferably connected with the parallel arm.

A second parallel arm is preferably provided between a node of the series-arm resonators S1 and S2 and the ground potential. An inductance L1 is preferably connected with the second parallel arm. Also, a variable capacitor C3 is preferably connected with the series-arm resonator S2 at the output side of the series-arm resonator S2. Further, a third parallel arm preferably couples the output terminal 23 and the ground potential to each other. A capacitor C4 is preferably connected with the third parallel arm.

In this example, the series-arm resonators S1 and S2 each used a $LiNbO_3$ substrate of 15° Y cut X propagation, i.e., with Euler angles of (0°, 105°, 0°). Al as the electrode material was embedded in grooves in an upper surface of the $LiNbO_3$ substrate, and thus, an IDT electrode and reflectors with a normalized film thickness H/λ of about 0.17 were provided. The ZnO film was not provided. Also, in the structure in which the variable capacitors C2 and C3 have equivalent electrostatic capacities, as shown in FIG. 4, the electrostatic capacities were changed to about 1 pF, about 2 pF, about 5 pF, about 10 pF, about 25 pF, about 50 pF, or about 100 pF and the filter characteristic was measured.

The electrostatic capacities of the series-arm resonators S1 and S2 were adjusted by changing the number of pairs or the intersecting width of electrode fingers of the IDT electrode. The inductance L1 had a value of about 12 nH.

Figure 4:
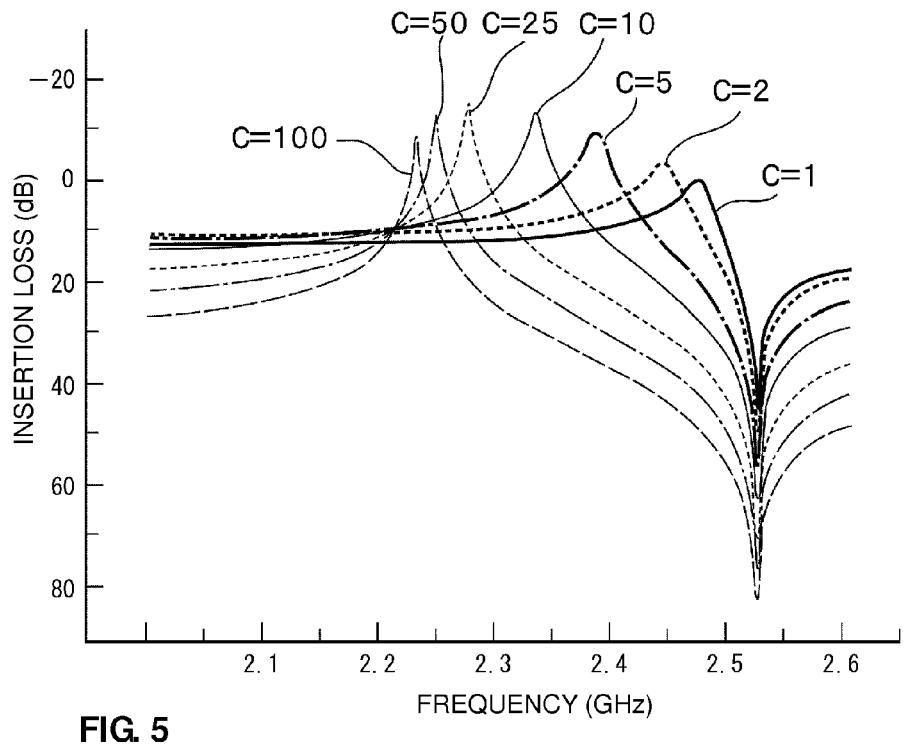
FIG. 4 is an illustration showing a change in filter characteristic when an electrostatic capacity of a variable capacitor in the filter circuit in Example 2 shown in FIG. 3 is changed in Example 2.

FIG. 4 shows a change in filter characteristic when the electrostatic capacities of the variable capacitors C2 and C3 were equivalent to each other and the electrostatic capacities of the variable capacitors C2 and C3 were changed. As shown FIG. 4, as the capacity is changed from about 1 pF to about 100 pF, the center frequency of the filter is changed within an area from approximately 2.3 GHz to approximately 2.48 GHz. Namely, the center frequency is changed by about 11%. Thus, the pass band of the filter having such a ladder-type circuit configuration can be adjusted by changing the electrostatic capacities of the capacitors C1 to C4.

In this example, $LiNbO_3$ with the Euler angles of (0°, 105°, 0°), for example, was preferably used. However, the inventor of the present invention discovered that a result similar to that of this example could be obtained even if a $LiNbO_3$ substrate with Euler angles of (0°, 105°±20°, 0°) was used.

As understood based on Example 2, the frequency characteristics of the tunable filter 1 according to a preferred embodiment can be also easily adjusted by changing the electrostatic capacities of the capacitors 4 to 8.

EXAMPLE 3

In the surface acoustic wave resonator 10 shown in FIG. 1B and FIG. 1C, the ZnO film 15 is preferably arranged to cover the upper surface 11a of the piezoelectric substrate 11. With the ZnO film 15, the electromechanical coupling coefficient of the surface acoustic wave resonator can be effectively increased. This will be described more specifically below.

Figure 5:
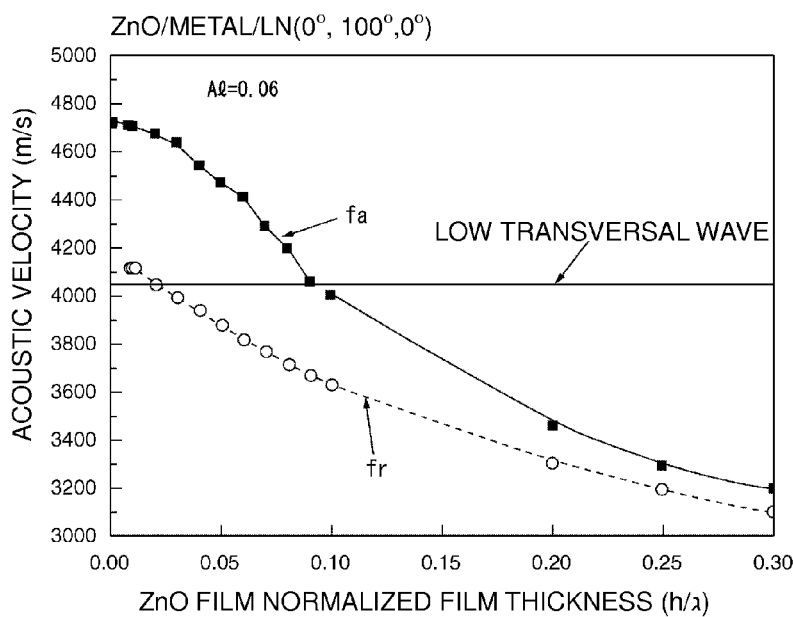
FIG. 5 is an illustration showing a change in surface acoustic wave velocity obtained in Example 3 if a normalized film thickness h/λ of a ZnO film is changed when a film thickness of an Al electrode is about 0.06.
Figure 6:
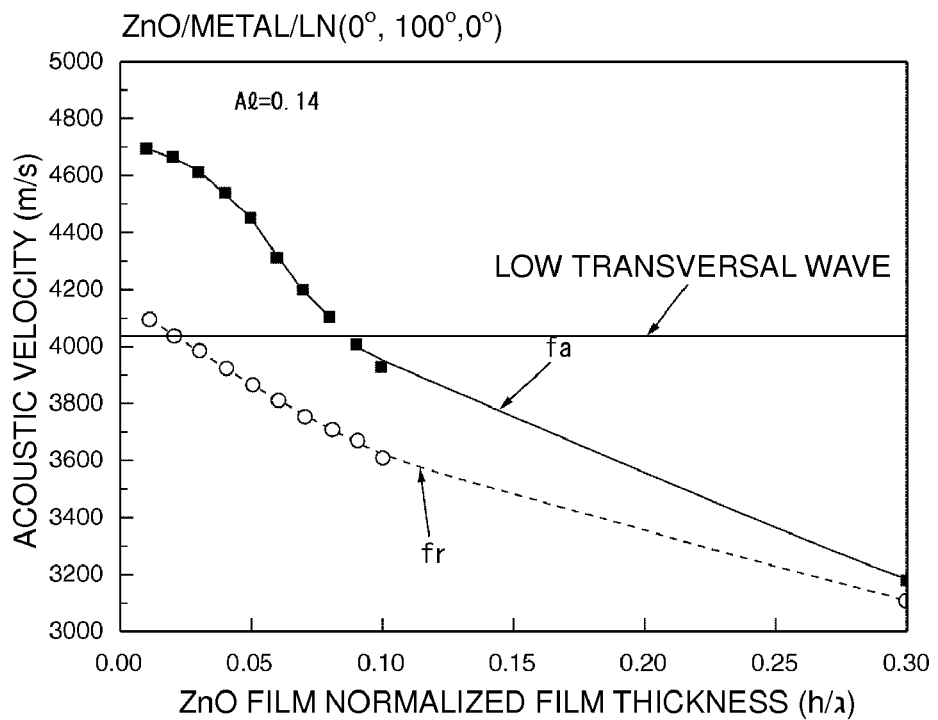
FIG. 6 is an illustration showing a change in surface acoustic wave velocity obtained in Example 3 if the normalized film thickness h/λ of the ZnO film is changed when the film thickness of the Al electrode is about 0.14.
Figure 7:
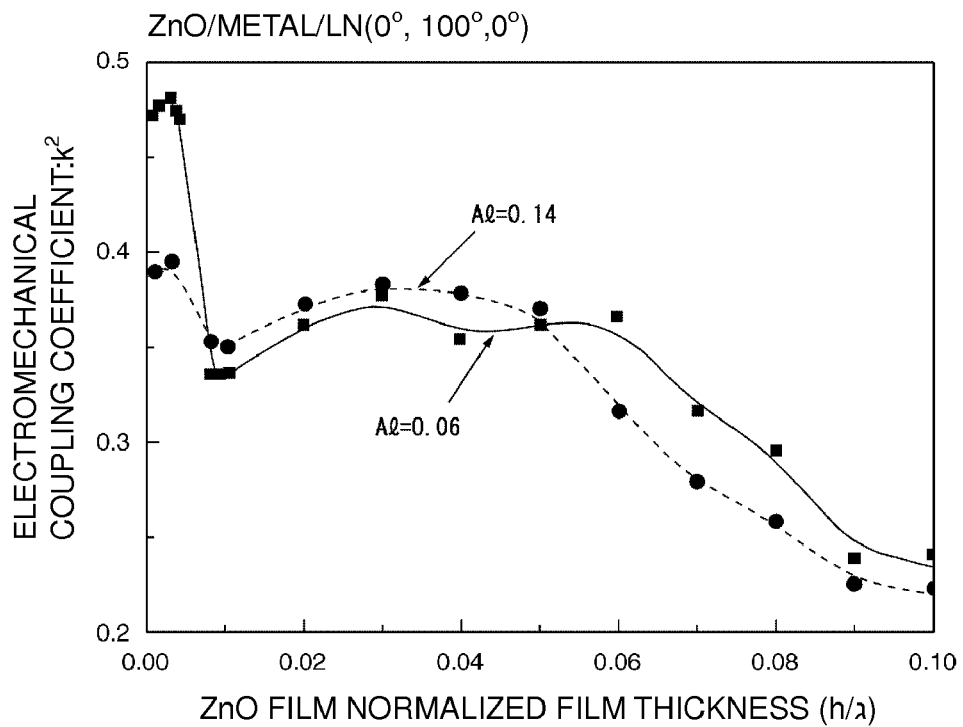
FIG. 7 is an illustration showing a change in electromechanical coupling coefficient $k^2$ obtained in Example 3 if the normalized film thickness h/λ of the ZnO film is changed.

FIGS. 5, 6, and 7 are illustrations showing the relationship between the normalized film thickness h/λ of ZnO and the surface acoustic wave velocity, and the relationship between the normalized film thickness h/λ of ZnO and the electromechanical coupling coefficient $k^2$, of a surface acoustic wave resonator when a $LiNbO_3$ substrate of 10° rotated Y plate X propagation, i.e., with Euler angles of (0°, 100°, 0°) was used as the piezoelectric substrate and an IDT electrode made of Al and having normalized thicknesses of about 0.06 or about 0.14. Here, h is a thickness of the ZnO film, and λ is a wavelength determined by the pitch of electrode fingers of the IDT electrode.

In FIGS. 5 and 6, fa is an acoustic velocity corresponding to the anti-resonant frequency, and fr is an acoustic velocity corresponding to the resonant frequency. Good resonator characteristics are obtained if both fa and fr are in a higher region and a lower region with respect to a low transversal bulk wave velocity.

The low transversal bulk wave velocity of $LiNbO_3$ is about 4030 m/s.

As shown in FIGS. 5 and 6, good resonator characteristics are not obtained when the normalized film thickness h/λ of ZnO is in a range from about 0.02 to about 0.085 regardless of the thickness of the Al electrode. Accordingly, a preferably range of the thickness h/λ of the ZnO film is a range from 0 to about 0.02, and a range from about 0.085 to about 0.3, for example. Also, referring to FIG. 7, a large electromechanical coupling coefficient $k^2$ is obtained when the thickness h/λ of the ZnO film is in a range from about 0.0007 to about 0.006, whereas the electromechanical coupling coefficient $k^2$ is decreased when the thickness h/λ is about 0.09 or greater.

EXAMPLE 4

Next, $LiNbO_3$ of 10° rotated Y plate X propagation, i.e., $LiNbO_3$ with Euler angles of (0°, 100°, 0°) was used as the piezoelectric substrate 11. A Cu film having a thickness H/λ of about 0.06 or about 0.1 was used as the electrode material. The normalized film thickness h/λ of the ZnO film 15 was changed, and a change in acoustic velocity, a change in reflection coefficient, and a change in electromechanical coupling coefficient $k^2$ of the surface acoustic wave resonator were obtained. The results are shown in FIGS. 8, 9, 10, and 11.

Figure 8:
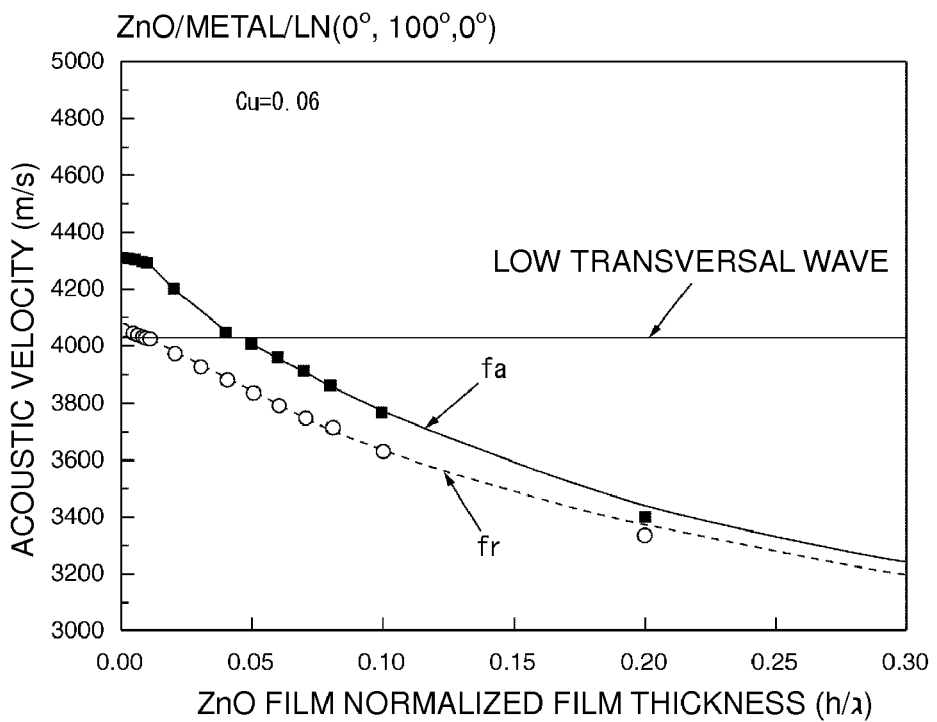
FIG. 8 is an illustration showing a change in surface acoustic wave velocity obtained in Example 4 if the normalized film thickness h/λ of the ZnO film is changed when a film thickness of a Cu electrode is about 0.06.
Figure 9:
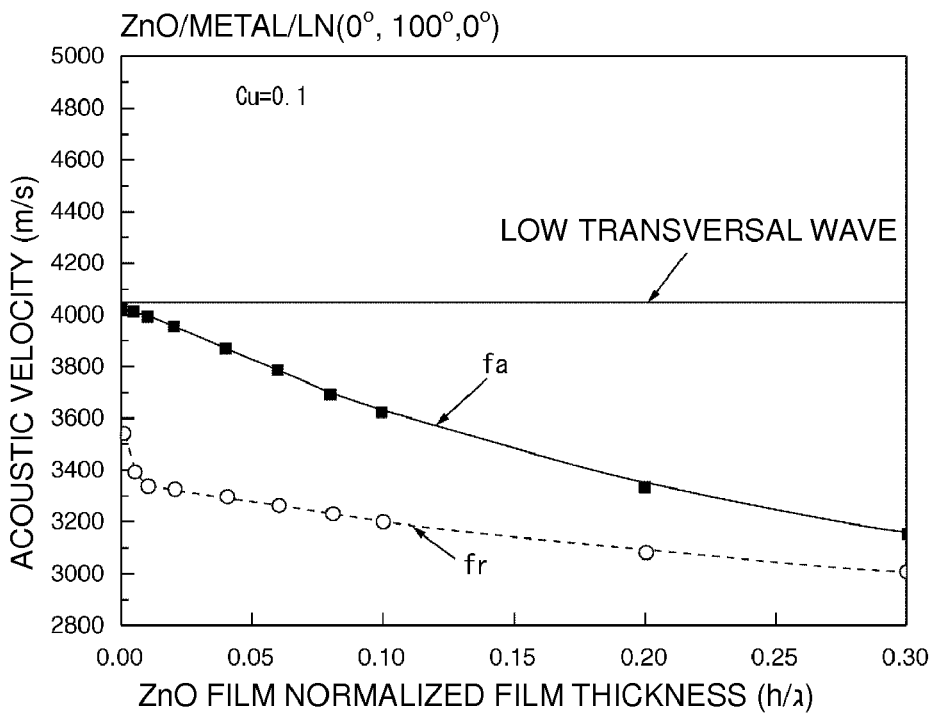
FIG. 9 is an illustration showing a change in surface acoustic wave velocity obtained in Example 4 if the normalized film thickness h/λ of the ZnO film is changed when the film thickness of the Cu electrode is about 0.10.

As shown in FIG. 8, when the Cu thickness H/λ is about 0.06, the range of the thickness h/λ of the ZnO film that causes both fa and fr to be higher and lower than the low transversal wave is a range from 0 to about 0.012 and a range from about 0.05 to about 0.3. Good resonator characteristics are obtained in the ranges of the film thickness of ZnO. In contrast, as shown in FIG. 9, when the thickness H/λ of Cu is about 0.1, both fa and fr are lower than the transversal bulk wave velocity regardless of the film thickness h/λ of the ZnO film, good resonator characteristics are obtained when the film thickness h/λ of the ZnO is in a range from 0 to about 0.3 as illustrated.

Figure 10:
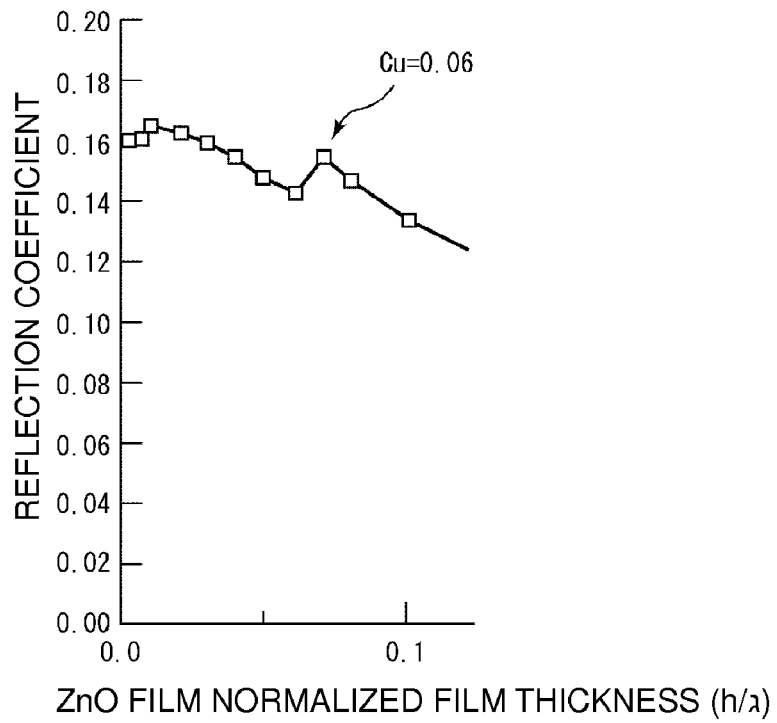
FIG. 10 is an illustration showing the relationship obtained in Example 4 between the normalized film thickness h/λ of the ZnO film in the surface acoustic wave resonator and the reflection coefficient.
Figure 11:
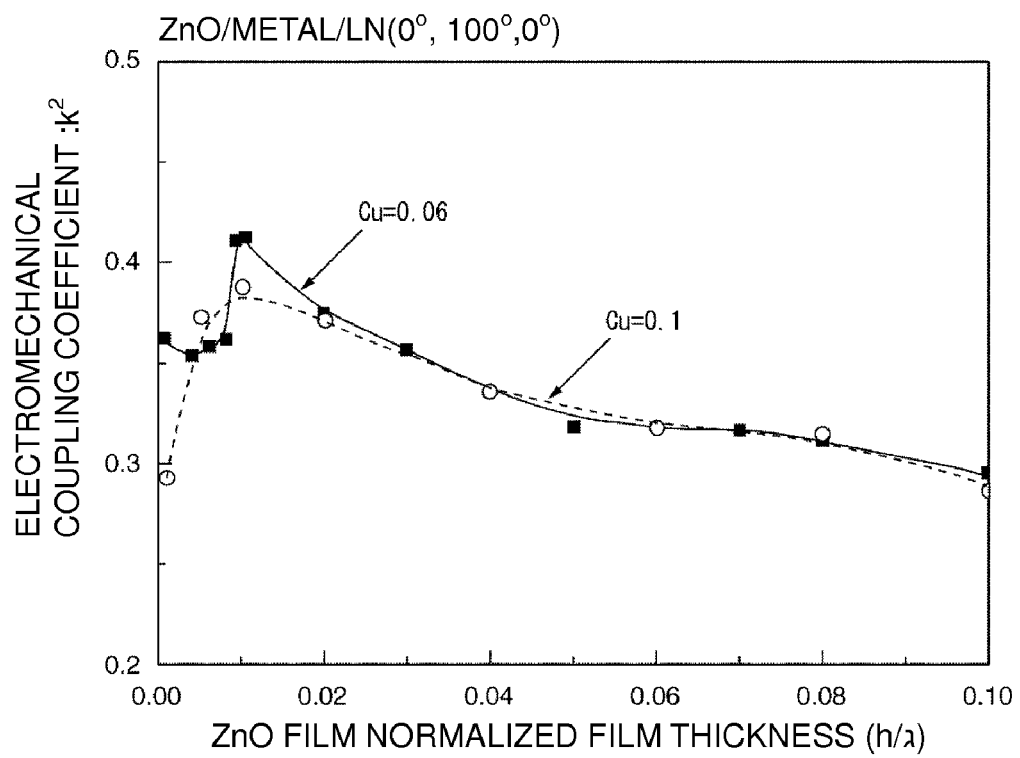
FIG. 11 is an illustration showing the relationship obtained in Example 4 between the normalized film thickness h/λ of the ZnO film in the surface acoustic wave resonator and the electromechanical coupling coefficient $k^2$.

Also, as shown in FIG. 10, the reflection coefficient is relatively large in a region in which the film thickness h/λ of ZnO is in a range from 0 to about 0.1. As shown in FIG. 11, when the thickness H/λ of Cu is about 0.06 or about 0.1, a large electromechanical coupling coefficient $k^2$ is obtained as long as the film thickness h/λ of ZnO is in a range from about 0.004 to about 0.04. If the film thickness h/λ of ZnO is greater than about 0.04, the electromechanical coupling coefficient $k^2$ is small. Thus, good resonator characteristics are obtained, and a large reflection coefficient and a large electromechanical coupling coefficient $k^2$ are obtained. The range of the film thickness h/λ of ZnO is preferably in the range from about 0.004 to about 0.04, for example, regardless of the thickness of Cu.

Therefore, preferably, the normalized film thickness h/λ of the ZnO film is about 0.04 or less, for example. Accordingly, by providing the ZnO film, it was determined that the electromechanical coupling coefficient $k^2$ is effectively increased and the band width ratio of the tunable filter is increased accordingly.

EXAMPLE 5

A configuration of Example 5 is similar to the configuration of Example 4, except that Ni is used as the electrode material instead of Cu and has a thickness H/λ of about 0.04. Similar to Example 4, the normalized film thickness h/λ of the ZnO film was changed, and a change in acoustic velocity, a change in reflection coefficient, and a change in electromechanical coupling coefficient $k^2$ were obtained. The results are shown in FIGS. 12, 13, and 14.

Figure 12:
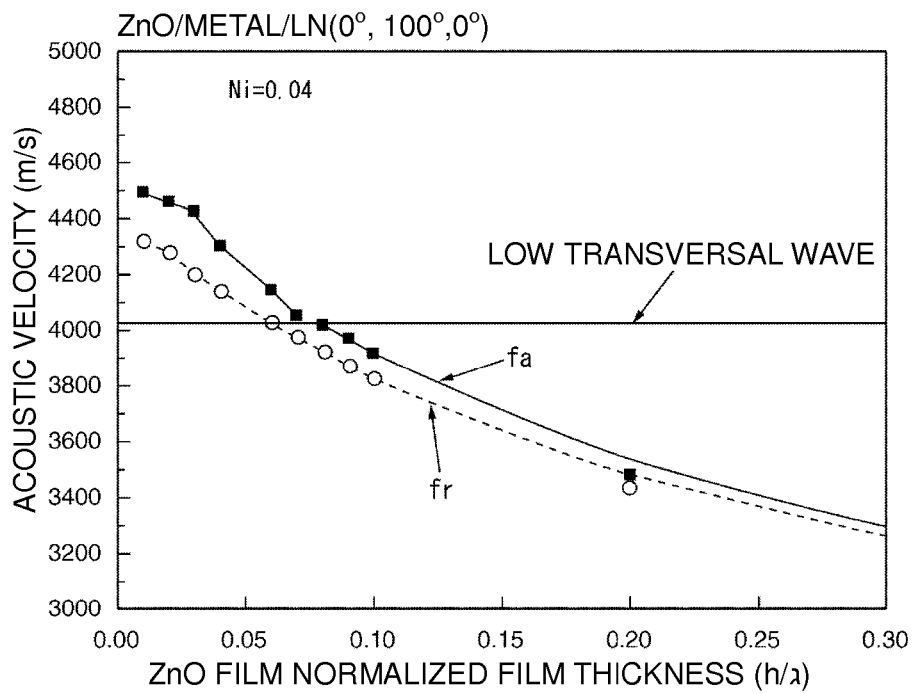
FIG. 12 is an illustration showing a change in surface acoustic wave velocity obtained in Example 5 if the normalized film thickness h/λ of the ZnO film is changed when the film thickness of a Ni electrode is about 0.04.

Referring to FIG. 12, a range of the film thickness h/λ of the ZnO film that causes both fa and fr to be greater than the low transversal bulk wave velocity is a range from 0 to about 0.062.

Figure 13:
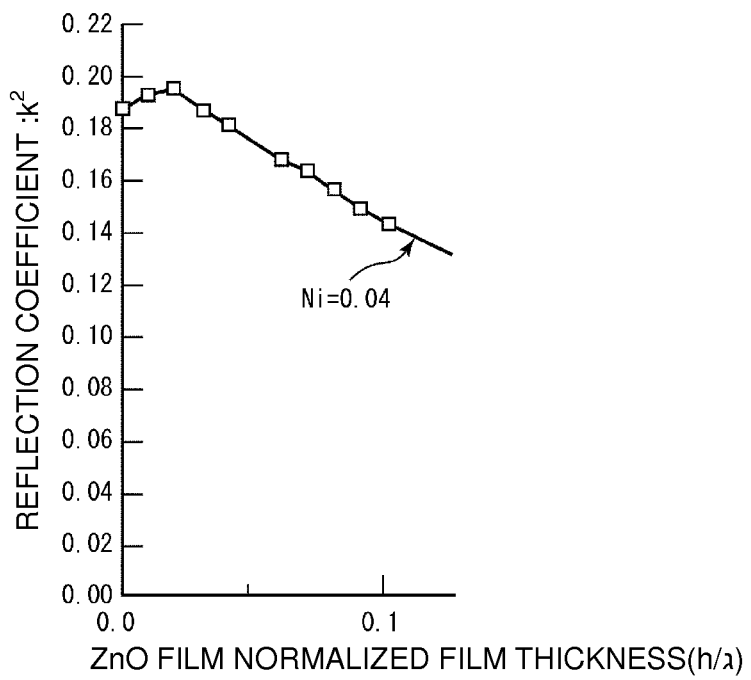
FIG. 13 is an illustration showing the relationship obtained in Example 5 between the normalized film thickness h/λ of the ZnO film in the surface acoustic wave resonator and the reflection coefficient.
Figure 14:
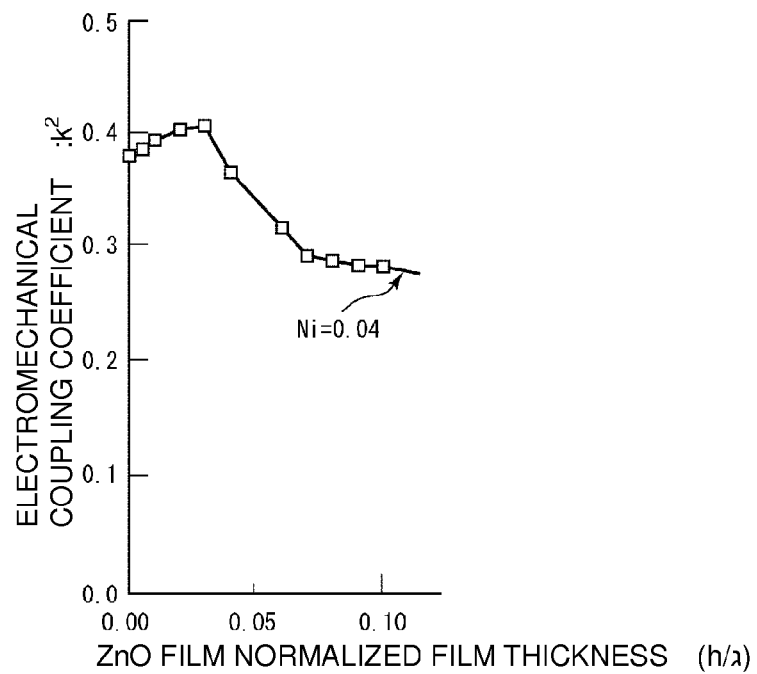
FIG. 14 is an illustration showing the relationship between the normalized film thickness h/λ of the ZnO film in the surface acoustic wave resonator and the electromechanical coupling coefficient $k^2$ obtained in Example 5.

In FIG. 13, the reflection coefficient is large when the film thickness h/λ of the ZnO is in a range from 0 to about 0.045. In FIG. 14, the electromechanical coupling coefficient is large when the film thickness h/λ of the ZnO is in the range from 0 to about 0.045.

When the film thickness h/λ of ZnO is 0, the electromechanical coupling coefficient $k^2$ is about 0.375. When the film thickness h/λ of ZnO is about 0.005, the electromechanical coupling coefficient $k^2$ is about 0.39. When h/λ is about 0.03, the electromechanical coupling coefficient $k^2$ is about 0.42. As the film thickness h/λ increases to larger values, the electromechanical coupling coefficient $k^2$ gradually decreases. When the thickness h/λ of ZnO is about 0.05, the electromechanical coupling coefficient $k^2$ is about 0.35, for example.

Preferably, if the thickness of the ZnO film h/λ is about 0.045 or less, for example, it was determined that the electromechanical coupling coefficient $k^2$ is effectively increased, and the band width ratio of the tunable filter 1 is increased.

Figure 15:
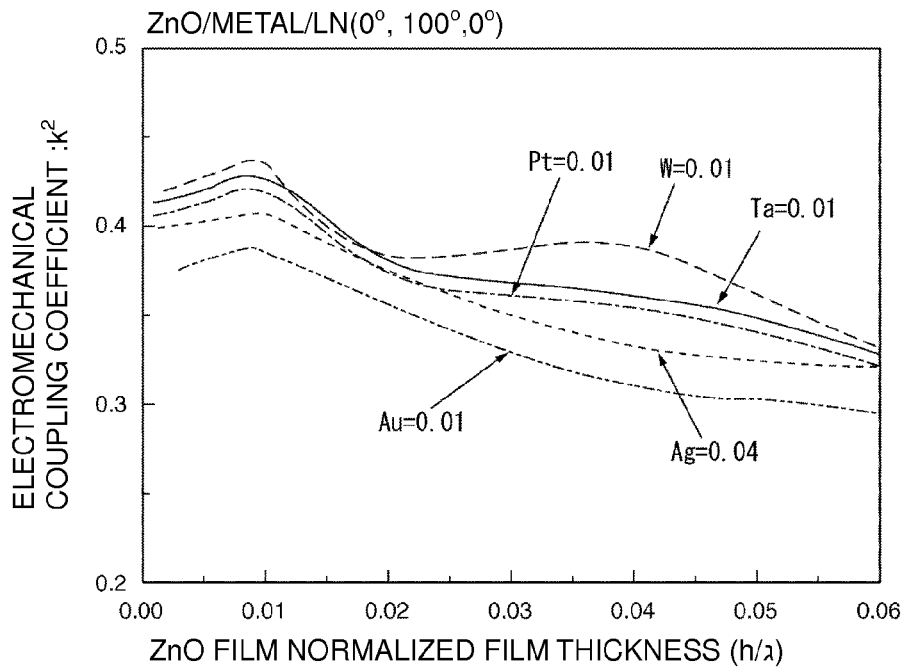
FIG. 15 is an illustration showing a change in surface acoustic wave velocity if the normalized film thickness h/λ of the ZnO film is changed for an electrode of Pt, Au, W, Ta, or Ag.

FIG. 15 shows the relationship between the film thickness of ZnO and the electromechanical coupling coefficient $k^2$ with an Ag electrode having a thickness H/λ of about 0.04, a Ta electrode having a thickness H/λ of about 0.01, a W electrode having a thickness H/λ of about 0.01), a Pt electrode having a thickness H/λ of about 0.01), and an Au electrode having a thickness H/λ of about 0.01. In any case, a large electromechanical coupling coefficient $k^2$ is obtained when the film thickness h/λ of ZnO is in a range from about 0.005 to about 0.14, for example.

Figure 16:
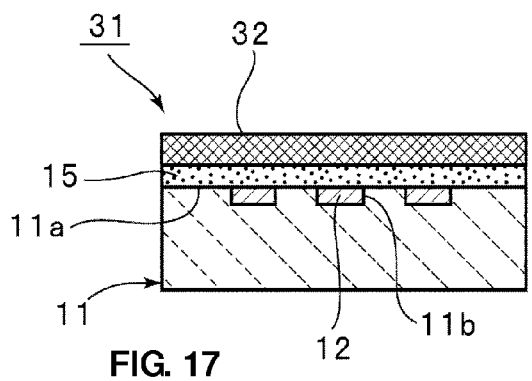
FIG. 16 is a schematic cross-sectional view of a surface acoustic wave resonator used in a tunable filter according to a modification of a preferred embodiment of the present invention.
Figure 17:
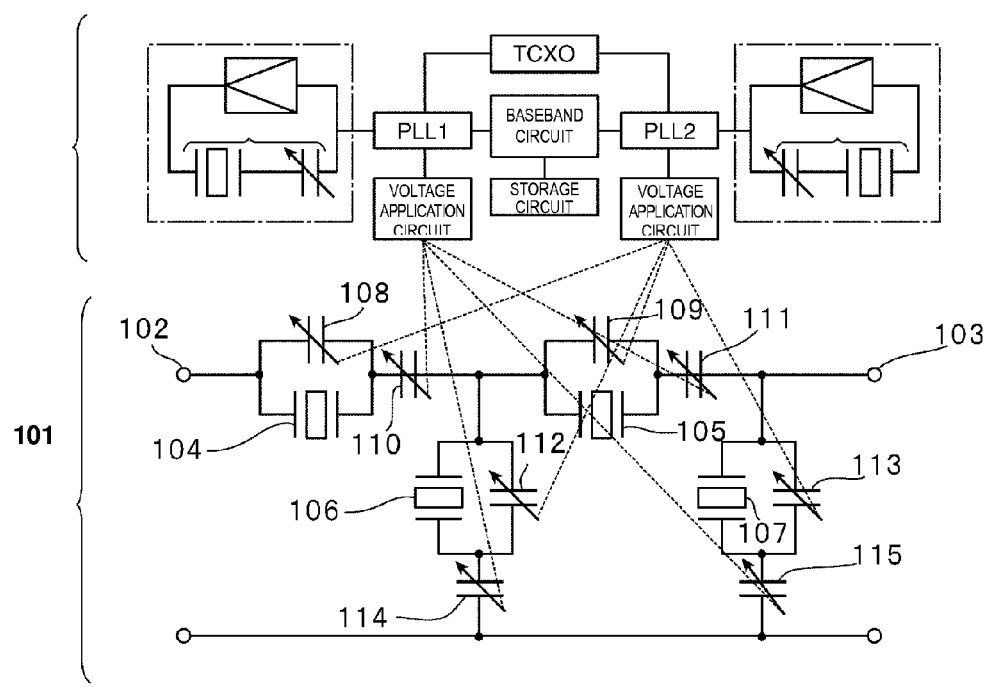
FIG. 17 is a circuit diagram showing a circuit configuration of a tunable filter according to the related art.

FIG. 16 is a front cross-sectional view showing a modification of a surface acoustic wave resonator according to a preferred embodiment of the present invention. A surface acoustic wave resonator 31 of this modification is similar to the surface acoustic wave resonator 10 shown in FIG. 1B and FIG. 1C, except that a $SiO_2$ film 32 is provided on a ZnO film 15. A temperature coefficient of frequency TCF of the $SiO_2$ film has a positive value, and a temperature coefficient of frequency TCF of $LiNbO_3$ or $LiTaO_3$ has a negative value. Therefore, by providing the $SiO_2$ film 32 with the positive TCF, the absolute value of the temperature coefficient of frequency TCF of the surface acoustic wave resonator 31 is effectively decreased. By using such a surface acoustic wave resonator 31 as a series-arm resonator or a parallel-arm resonator, a change in frequency characteristic as the result of a change in temperature is decreased. Thus, the temperature characteristics are improved.

It is to be noted that substantially the same frequency temperature characteristic can be obtained even when the arrangement of the $SiO_2$ film and the ZnO film are reversed.

In the above-described preferred embodiments and examples thereof, the piezoelectric substrate is preferably made of $LiNbO_3$, for example. However, the piezoelectric substrate may be made of $LiTaO_3$.

Also, in the above-described examples, $LiNbO_3$ with the Euler angles of (0°, 100°, 0°), for example, has preferably been used. However, the inventor of the present invention has discovered that similar results are obtained as long as θ of the Euler angles is within a range of about 100°±20°, for example.

Also, in preferred embodiments of the present invention, the values of ϕ and ψ of the Euler angles (0°, 100°±20°, 0°) are not limited to 0°, and a similar result is obtained as long as the values of ϕ and ψ each are within a range of about 0°±5°, for example. Thus, 0° of each of ϕ and ψ of the Euler angles may be varied by about ±5°. The range of about ±5° is an allowable range for the variation.

In the above-described preferred embodiments and examples thereof, the electrode material is preferably Ni, Cu, Au, Pt, W, Ta, Ag, or Al, for example. However, an alloy of any of these materials may be used. Alternatively, other metal, such as Mo, for example, may be used. Also, an IDT electrode may be formed using an electrode material made of a plurality of metals or alloys, and forming a laminated metal film in a recess. Since Ta and W have high melting points, expensive equipment for sputtering or ion plating is required for forming the film.

Also, in the above-described preferred embodiments and examples thereof, an electrode preferably made of a single metal has been described. However, an electrode may include a laminated body including electrode layers including a plurality of different metals. An average density is a value obtained by dividing the sum total of products of densities and film thicknesses of the metals that define the electrode layers by the sum total of film thicknesses of the electrode layers. By determining the film thickness of ZnO to be the same film thickness of ZnO when a single metal having substantially the same density as the average density is used, even if the laminated body is used, the same advantage as that obtained when the single metal is used can be obtained.

While preferred embodiments of the present invention have been described above, it is to be understood that variations and modifications will be apparent to those skilled in the art without departing from the scope and spirit of the present invention. The scope of the present invention, therefore, is to be determined solely by the following claims.

What is claimed is:

1. A tunable filter, comprising:
a surface acoustic wave resonator including:
a piezoelectric substrate including a recess in an upper surface thereof;
an IDT electrode defined by an electrode material provided in the recess in the upper surface of the piezoelectric substrate;
a ZnO film arranged to cover the upper surface of the piezoelectric substrate; and
a variable capacitor connected with the surface acoustic wave resonator; wherein
the piezoelectric substrate is a LiNbO$_3$ substrate with Euler angles of (0°, 100°+20°, 0°), and the electrode material defining the IDT electrode is one of Al, Ag, Pt, Au, Ta, W, Mo, Ni, or Cu; and
the IDT electrode of the surface acoustic wave resonator is primarily made of an electrode layer made of Al, and when h is a thickness of the ZnO film and λ is a wavelength determined by a pitch of electrode fingers of the IDT electrode of the surface acoustic wave resonator, a normalized film thickness h/λ of the ZnO film is in a range from about 0.0007 to about 0.006.

2. The tunable filter according to claim 1 further comprising a SiO$_2$ film provided on the ZnO film.

3. The tunable filter according to claim 1 further comprising a SiO$_2$ film provided between the upper surface of the piezoelectric substrate and the ZnO film.

4. A tunable filter, comprising:
a surface acoustic wave resonator including:
a piezoelectric substrate including a recess in an upper surface thereof;
an IDT electrode defined by an electrode material provided in the recess in the upper surface of the piezoelectric substrate;
a ZnO film arranged to cover the upper surface of the piezoelectric substrate; and
a variable capacitor connected with the surface acoustic wave resonator; wherein
the piezoelectric substrate is a LiNbO$_3$ substrate with Euler angles of (0°, 100°+20°, 0°), and the electrode material defining the IDT electrode is one of Al, Ag, Pt, Au, Ta, W, Mo, Ni, or Cu; and
the IDT electrode of the surface acoustic wave resonator is primarily made of an electrode layer that is made of a material selected from Ni, Cu, Mo, and an alloy primarily made of at least one of Ni, Cu, and Mo, and when h is a thickness of the ZnO film and λ is a wavelength determined by a pitch of electrode fingers of the IDT electrode, a normalized film thickness h/λ of the ZnO film is in a range from about 0.004 to about 0.045.

5. The tunable filter according to claim 4, wherein the IDT electrode includes a laminated body including the electrode layer and a second electrode layer that is made of a metal different from the metal of the electrode layer, and an average density of the laminated body is substantially the same as a density of the metal or an alloy of the electrode layer.

6. The tunable filter according to claim 4, further comprising a SiO$_2$ film provided on the ZnO film.

7. The tunable filter according to claim 4, further comprising a SiO$_2$ film provided between the upper surface of the piezoelectric substrate and the ZnO film.

8. A tunable filter, comprising:
a surface acoustic wave resonator including:
a piezoelectric substrate including a recess in an upper surface thereof;
an IDT electrode defined by an electrode material provided in the recess in the upper surface of the piezoelectric substrate;
a ZnO film arranged to cover the upper surface of the piezoelectric substrate; and
a variable capacitor connected with the surface acoustic wave resonator; wherein
the piezoelectric substrate is a LiNbO$_3$ substrate with Euler angles of (0°, 100°+20°, 0°), and the electrode material defining the IDT electrode is one of Al, Ag, Pt, Au, Ta, W, Mo, Ni, or Cu; and
the IDT electrode of the surface acoustic wave resonator is primarily made of an electrode layer that is made of a material selected from Pt, Au, W, Ta, Ag, and an alloy primarily made of at least one of Pt, Au, W, Ta, and Ag, and when h is a thickness of the ZnO film and λ is a wavelength determined by a pitch of electrode fingers of the IDT electrode, a normalized film thickness h/λ of the ZnO film is in a range from about 0.005 to about 0.14.

9. The tunable filter according to claim 8, further comprising a SiO$_2$ film provided on the ZnO film.

10. The tunable filter according to claim 8, further comprising a SiO$_2$ film provided between the upper surface of the piezoelectric substrate and the ZnO film.

* * * * *